(12) United States Patent
Katakura

(10) Patent No.: US 11,133,228 B2
(45) Date of Patent: Sep. 28, 2021

(54) SEMICONDUCTOR INTEGRATED CIRCUIT

(71) Applicant: FUJI ELECTRIC CO., LTD., Kawasaki (JP)

(72) Inventor: Hideaki Katakura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/800,672

(22) Filed: Feb. 25, 2020

(65) Prior Publication Data

US 2020/0303262 A1 Sep. 24, 2020

(30) Foreign Application Priority Data

Mar. 18, 2019 (JP) .................. JP2019-50221

(51) Int. Cl.
*H01L 29/04* (2006.01)
*H01L 21/8238* (2006.01)
(Continued)

(52) U.S. Cl.
CPC .... *H01L 21/823857* (2013.01); *H01L 21/265* (2013.01); *H01L 21/28176* (2013.01);
(Continued)

(58) Field of Classification Search
CPC .......... H01L 21/823857; H01L 21/265; H01L 21/28176; H01L 29/7808; H01L 29/04; H01L 29/861; H01L 29/7804; H01L 27/04; H01L 29/78; H01L 27/0255; H01L 29/0619; H01L 29/0638; H01L 29/16; H01L 29/8605; H01L 2924/1207;
(Continued)

(56) References Cited

U.S. PATENT DOCUMENTS 6,420,217 B1 * 7/2002 Kalnitsky ........... H01L 23/5256
257/E23.149
2009/0039432 A1 * 2/2009 Nishimura .......... H01L 27/0629
257/362
(Continued)

FOREIGN PATENT DOCUMENTS

JP    5-243497 A    9/1993
JP    7-50303 A     2/1995
JP    7-273328 A    10/1995

*Primary Examiner* — Shahed Ahmed

(57) ABSTRACT

A semiconductor integrated circuit includes: a semiconductor monocrystalline region; an insulating film provided on a main surface of the semiconductor monocrystalline region; a conductive layer having a rectangular shape provided on the insulating film and including at least a polycrystalline layer of p-type; electric-field relaxing layers having a lower specific resistivity than the conductive layer and each including a polycrystalline layer of n-type so as to be arranged on both sides of the conductive layer in a direction perpendicular to a current-flowing direction; a high-potential-side electrode in ohmic contact with the conductive layer at one end of the conductive layer in the current-flowing direction; and a low-potential-side electrode in ohmic contact with the conductive layer and the respective electric-field relaxing layers at another end of the conductive layer opposed to the one end in the current-flowing direction, and having a lower potential than the high-potential-side electrode.

4 Claims, 7 Drawing Sheets

(51) Int. Cl.
*H01L 21/265* (2006.01)
*H01L 21/28* (2006.01)
*H01L 29/78* (2006.01)
*H01L 29/861* (2006.01)
*H01L 27/04* (2006.01)

(52) U.S. Cl.
CPC .............. *H01L 27/04* (2013.01); *H01L 29/04* (2013.01); *H01L 29/7804* (2013.01); *H01L 29/7808* (2013.01); *H01L 29/861* (2013.01)

(58) Field of Classification Search
CPC ..... H01L 2924/19043; H01L 28/20–26; H01L 27/0647–0652; H01L 27/067–0682; H01L 27/0711–0727; H01L 27/075–0755; H01L 27/0783–0794
See application file for complete search history.

(56) References Cited

U.S. PATENT DOCUMENTS

| | | | |
|---|---|---|---|
| 2015/0029787 A1* | 1/2015 | Chen | H01L 45/10 365/163 |
| 2018/0233499 A1* | 8/2018 | Wen | H01L 29/8605 |
| 2019/0372477 A1* | 12/2019 | Pidutti | H03K 17/145 |

* cited by examiner

SEMICONDUCTOR INTEGRATED CIRCUIT

CROSS-REFERENCE TO RELATED APPLICATION

This application claims benefit of priority under 35 USC 119 based on Japanese Patent Application No. 2019-050221 filed on Mar. 18, 2019, the entire contents of which are incorporated by reference herein.

BACKGROUND OF THE INVENTION

1. Field of the Invention

The present invention relates to a semiconductor integrated circuit including a semiconductor element using a polycrystalline layer.

2. Description of the Related Art

Semiconductor elements and wiring layers using polycrystalline silicon (polysilicon) thin films provided on field insulating films are used in semiconductor integrated circuits (ICs), for example. Impurity ions are implanted to a non-doped polysilicon film deposited on an insulating film such as a silicon oxide film and are subjected to annealing, and the polysilicon film is then delineated so as to form a semiconductor element or a wiring layer, for example.

JP H05-243497 discloses a resistor element in which a non-doped polysilicon film is formed around a doped polysilicon film over a semiconductor substrate, so as to improve precision of a resistance value of the polysilicon film. JP H07-50303 discloses p-n junction diodes in which a non-doped polysilicon film is deposited on an insulating film provided on a main surface of a substrate and is subjected to annealing at a high temperature to be reformed, and impurity ions are then implanted to the polysilicon film to alternately form p-type regions and n-type regions, so as to improve breakdown tolerance.

A polysilicon film is electrically connected to an active region or a control region provided in a substrate under an insulating film via a metal wiring layer. When a current flows through the polysilicon film, a voltage distribution is substantially uniform in the width direction of the polysilicon film perpendicular to the current-flowing direction. When the substrate side is led to a high potential due to a surge, for example, and the polysilicon film side is transitionally led to a negative potential due to an influence of a semiconductor element implementing a circuit, electrical breakdown may be caused in the insulating film between the substrate and the polysilicon film, in particular, under an end portion of the polysilicon film in the width direction. Setting a thickness of the insulating film to be greater for preventing the electrical breakdown leads to an increase in manufacturing cost.

JP H07-273328 discloses a method of preventing electrical breakdown with a thin insulating film such that electric field crowding at an end portion of a polysilicon film composing a diode is relaxed with a depletion layer produced from a diffusion layer formed by diffusion of impurity ions in a substrate. The position of the polysilicon film to be arranged, however, is limited since the arrangement of the diffusion layer formed in the substrate and the arrangement of the polysilicon film on an insulating film are correlated with each other.

SUMMARY OF THE INVENTION

In response to the above issue, the present invention provides a semiconductor integrated circuit capable of avoiding electrical breakdown of an insulating film provided between a main surface of a semiconductor monocrystalline region and a resistance layer of a polycrystalline layer.

An aspect of the present invention inheres in a semiconductor integrated circuit including: a semiconductor monocrystalline region; an insulating film provided on a main surface of the semiconductor monocrystalline region; a conductive layer having a rectangular shape provided on the insulating film and including at least a polycrystalline layer of p-type; electric-field relaxing layers having a lower specific resistivity than the conductive layer and each including a polycrystalline layer of n-type so as to be arranged on both sides of the conductive layer in a direction perpendicular to a current-flowing direction; a high-potential-side electrode in ohmic contact with the conductive layer at one end of the conductive layer in the current-flowing direction; and a low-potential-side electrode in ohmic contact with the conductive layer and the respective electric-field relaxing layers at another end of the conductive layer opposed to the one end in the current-flowing direction, and having a lower potential than the high-potential-side electrode.

DETAILED DESCRIPTION

Figure 1:
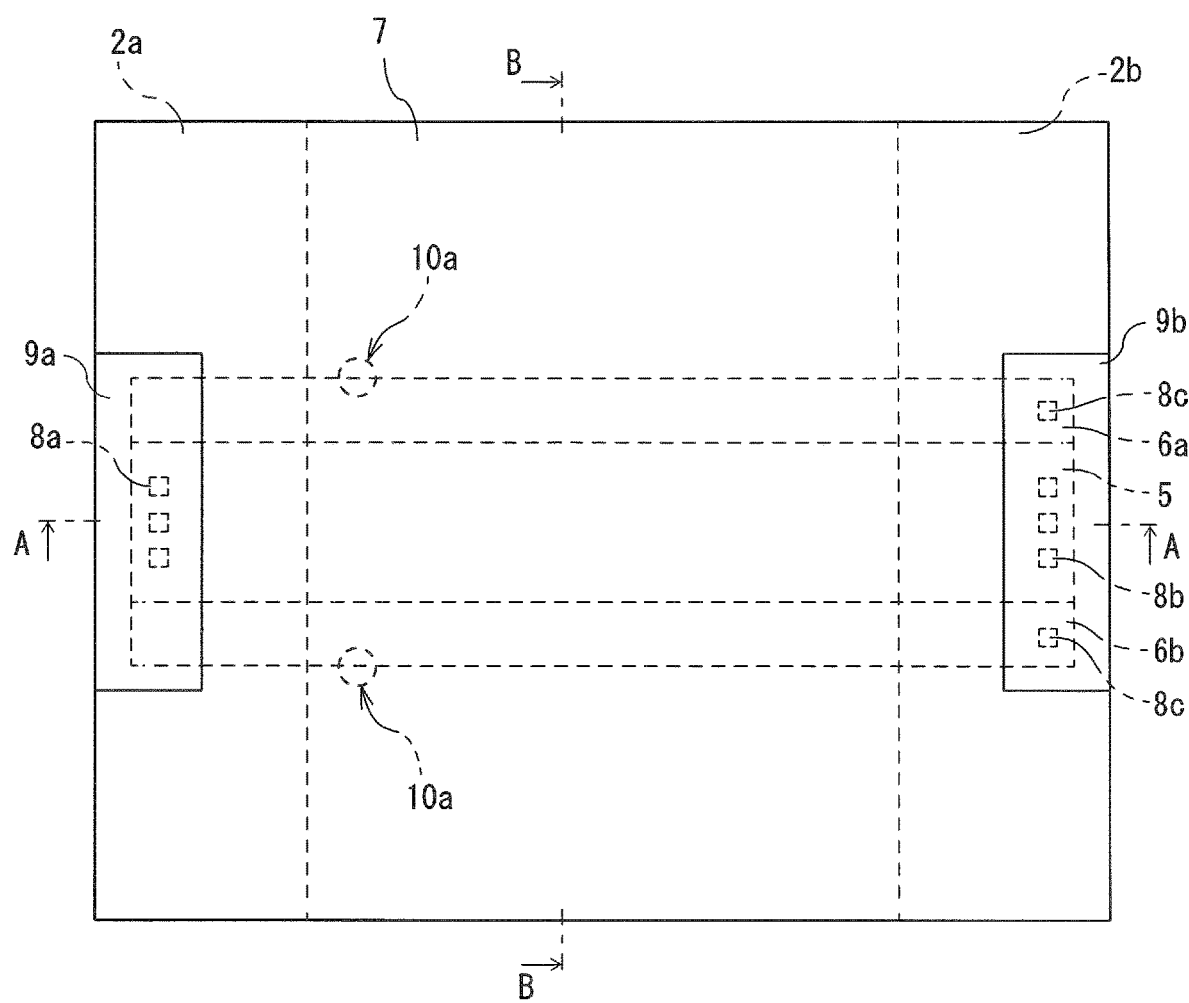
FIG. 1 is a schematic plan view illustrating a semiconductor element mounted on a semiconductor integrated circuit according to a first embodiment of the present invention.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. When the subject is observed while being rotated by 180°, the definitions of "front" and "back" are reversed.

First Embodiment

Figure 2:
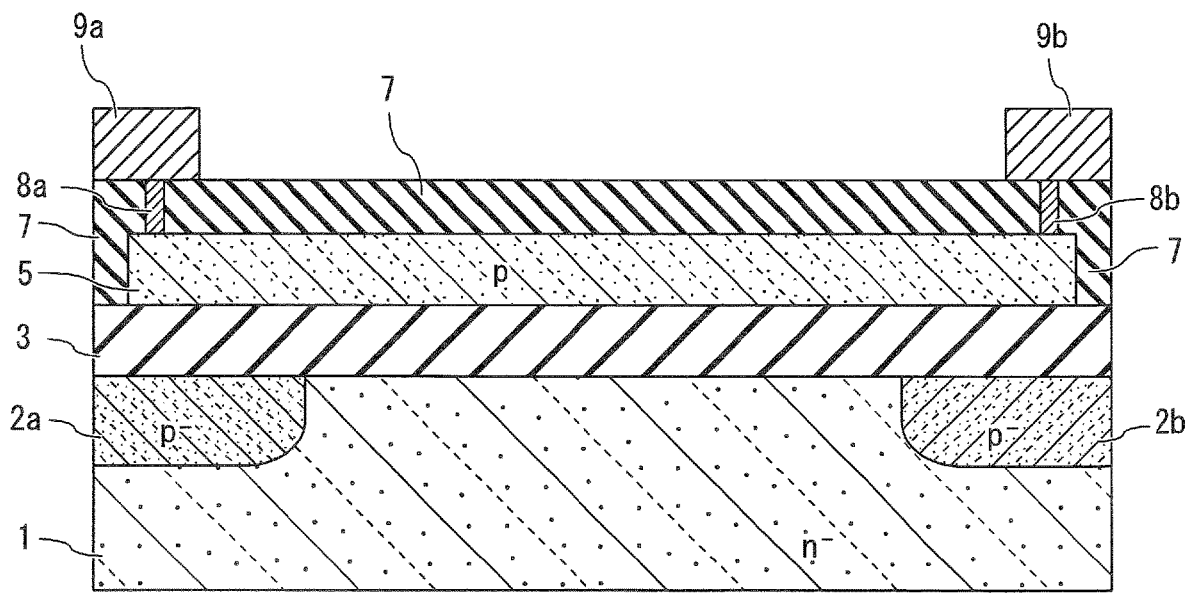
FIG. 2 is a schematic cross-sectional view vertically cross-sectioned along line A-A in FIG. 1.
Figure 3:
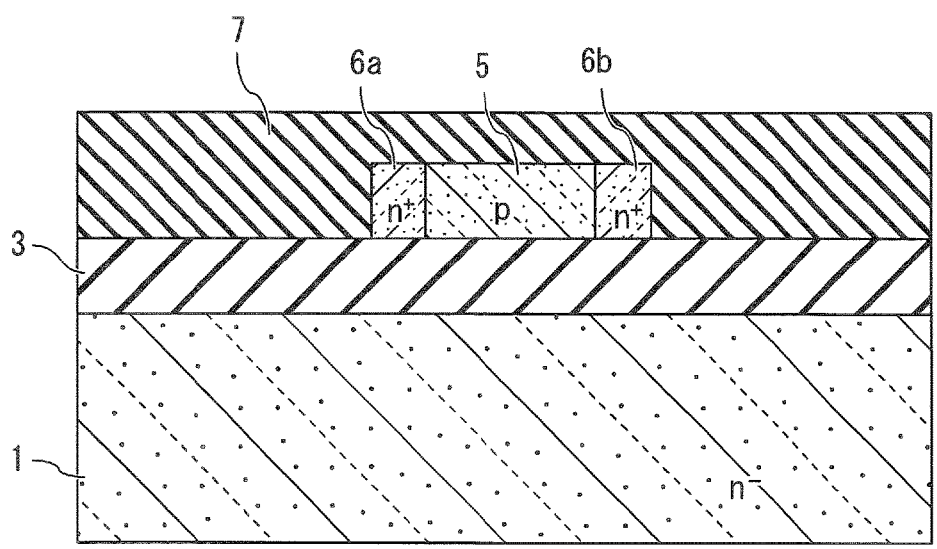
FIG. 3 is a schematic cross-sectional view vertically cross-sectioned along line B-B in FIG. 1.

A semiconductor element (5, 6a, 6b, 8a, 8b, 9a, 9b) used in a semiconductor integrated circuit according to the first embodiment of the present invention is a resistor element in which a resistor (5, 6a, 6b) is covered with an interlayer insulating film 7, as illustrated in FIG. 1, for example. As illustrated in FIG. 2 and FIG. 3, the resistor (5, 6a, 6b) is provided on the top surface of an insulating film 3 deposited on a drift region 1 as a semiconductor monocrystalline region of n⁻-type and diffusion regions 2a and 2b as semiconductor regions of p⁻-type selectively provided at an upper portion of the drift region 1. As illustrated in FIG. 1 and FIG. 3, the resistor (5, 6a, 6b) includes a conductive layer 5 having a rectangular shape including a polycrystalline layer of p-type, and electric-field relaxing layers 6a and 6b of n⁺-type provided on both sides of the conductive layer 5 in the width direction perpendicular to the longitudinal direction of the conductive layer 5. The electric-field relaxing layers 6a and 6b have lower specific resistivity than the conductive layer 5. The semiconductor element (5, 6a, 6b, 8a, 8b, 9a, 9b) includes a high-potential-side electrode 9a and a low-potential-side electrode 9b having a rectangular shape located at one end and the other end opposed to each other in the longitudinal direction.

As illustrated in FIG. 1 and FIG. 2, the high-potential-side electrode 9a is in ohmic contact with the conductive layer 5 of the resistor (5, 6a, 6b) via contact plugs 8a penetrating the interlayer insulating film 7 at one end in the longitudinal direction of the resistor (5, 6a, 6b). The low-potential-side electrode 9b is in ohmic contact with the conductive layer 5 of the resistor (5, 6a, 6b) via contact plugs 8b penetrating the interlayer insulating film 7 at the other end in the longitudinal direction of the resistor (5, 6a, 6b). The low-potential-side electrode 9b is also in ohmic contact with the respective electric-field relaxing layers 6a and 6b on both sides of the resistor (5, 6a, 6b) via contact plugs 8c penetrating the interlayer insulating film 7. The low-potential-side electrode 9b has lower potential than the high-potential-side electrode 9a, and a current flows from the high-potential-side electrode 9a to the low-potential-side electrode 9b during normal operation of the semiconductor integrated circuit. As illustrated in FIG. 2, the middle portion of the resistor (5, 6a, 6b) is opposed to the lower n⁻-type drift region 1 via the insulating film 3. Both ends of the resistor (5, 6a, 6b) are opposed to the respective type diffusion regions 2a and 2b provided in the lower semiconductor substrate via the insulating film 3.

The semiconductor element (5, 6a, 6b, 8a, 8b, 9a, 9b) according to the first embodiment is used as a gate resistor for a vertical insulated-gate semiconductor element such as an insulated-gate bipolar transistor (IGBT) or a MIS transistor. The conductive layer 5 of the resistor (5, 6a, 6b) is used as a resistance film, and the respective electric-field relaxing layers 6a and 6b serve as a passivation film at the end portions which are easily led to a high electrical field during operation. When the semiconductor element is used as a resistor element such as a gate resistor, a thickness of the conductive layer 5 is set in a range of about 0.2 micrometer to 0.6 micrometer, and a width is set to 2 micrometers, depending on the specifications required as the resistor element. The specific resistivity of the conductive layer 5 is typically set to a relatively high value. A width of the respective electric-field relaxing layers 6a and 6b is set in a range of about 0.5 micrometer to 1 micrometer, and the specific resistivity is set to a low value. As described above, the respective electric-field relaxing layers 6a and 6b with the low specific resistivity provided on both sides of the resistor (5, 6a, 6b) is electrically connected to the low-potential-side electrode 9b, so as to relax electrical field crowding at the end portion of the resistor (5, 6a, 6b).

While the conductive layer 5 is illustrated herein with p-type, the n-type conductive layer 5 may be used instead. When n-type polysilicon is used for the conductive layer 5, the n⁺-type electric-field relaxing layers 6a and 6b are also involved in the resistance value of the resistor element. Regulating the widths of the conductive layer 5 and the respective electric-field relaxing layers 6a and 6b can reduce the contribution of the electric-field relaxing layers 6a and 6b to the resistance value. A sheet resistance of the conductive layer 5 is set in a range of about 100 Ω/sq to 200 Ω/sq. The resistance value of the conductive layer 5 can be controlled by regulating the thickness, the width (in the direction toward the back side of the sheet of FIG. 1), the length (in the right-left direction in FIG. 1), and the specific resistivity of the conductive layer 5.

The conductive layer 5 preferably has a temperature coefficient of 0 ppm/C° or a negative temperature coefficient. The above temperature coefficient can avoid an increase in the resistance value during operation at a high temperature. For example, the semiconductor element according to the present embodiment used as a gate resistor in an IGBT can decrease a loss when the IGBT is in an on-state. The temperature coefficient of the conductive layer 5 can be controlled under the conditions in which impurity ions are implanted to the polysilicon. The temperature coefficient of the conductive layer 5 is not necessarily set to 0 ppm/C° or lower, and the conductive layer 5 may have a positive temperature coefficient.

The insulating film 3 may be a field insulating film such as a local oxidation of silicon (LOCOS) film or a shallow trench isolation (STI) film having a thickness of about 0.5 micrometer. The insulating film 3 may also be a silicon oxide ($SiO_2$) film or a silicon nitride ($Si_3N_4$) film, or a composite film of these films. The insulating film 3 may also be an insulating film deposited by a chemical vapor deposition (CVD) method using gas containing an organic silicon compound such as tetraethoxysilane (TEOS).

The interlayer insulating film 7 is deposited to cover the insulating film 3, the conductive layer 5, and the electric-field relaxing layers 6a and 6b. A thickness of the interlayer insulating film 7 is set in a range of about 1000 nanometers to 2000 nanometers. The interlayer insulating film 7 may be a silicon oxide film (a SiO$_2$ film) which is referred to as a non-doped silicate glass (NSG) film, a phosphosilicate glass film (PSG film), or a borosilicate glass film (a BSG film). Alternatively, the interlayer insulating film 7 may be either a single-layer film of a borophosphosilicate glass film (a BPSG film) or a silicon nitride film (Si$_3$N$_4$ film), or a composite layer of some of the above films combined together. For example, the interlayer insulating film 7 may be a composite film including a NSG film with a thickness of about 500 nanometers to 800 nanometers and a PSG film with a thickness of about 400 nanometers to 800 nanometers stacked on one another. The NSG film has a function of decreasing a variation in resistance. The PSG film has a function of ensuring a strength of wire bonding.

The high-potential-side electrode 9a and the low-potential-side electrode 9b may each be composed of a stacked film including a titanium/titanium nitride (Ti/TiN) film having a thickness of about 100 nanometers to 130 nanometers serving as barrier metal, an aluminum-silicon (Al—Si) film having a thickness of about 3 micrometers, and a TiN/Ti film having a thickness of about 35 nanometers to 55 nanometers serving as an anti-reflection film. Instead of Al—Si, Al or an Al alloy such as Al—Cu—Si and Al—Cu may be used.

A method of manufacturing the resistor (5, 6a, 6b) according to the first embodiment is described below. First, a polycrystalline film such as a non-doped polysilicon is deposited entirely on the insulating film 3. A thickness of the polycrystalline film to be deposited is set to be about 0.5 micrometer. The polycrystalline film is then delineated into a rectangular shape by photolithography or etching, for example. Next, p-type impurity ions such as boron (B) are selectively implanted to the middle portion of the polycrystalline film in the width direction by photolithography and an ion implantation method. Further, n-type impurity ions such as phosphorus (P) are selectively implanted to both sides of the polycrystalline film in the width direction by photolithography and an ion implantation method. The polycrystalline film after the ion implantation is subjected to annealing to activate the implanted impurity ions so as to form the p-type conductive layer 5 and the n-type electric-field relaxing layers 6a and 6b on both sides of the conductive layer 5. Next, the interlayer insulating film 7 such as a SiO$_2$ film is deposited by a CVD method, for example. The contact plugs 8a are then formed to penetrate the interlayer insulating film 7 only in the conductive layer 5 at one end on the high-potential side, and the contact plugs 8b and 8c are formed to penetrate the interlayer insulating film 7 in the conductive layer 5 and the respective electric-field relaxing layers 6a and 6b at the other end on the low-potential side. The contact plugs 8a are connected to the high-potential-side electrode 9a, and the contact plugs 8b and 8c are connected to the low-potential-side electrode 9b, so as to manufacture the semiconductor element (5, 6a, 6b, 8a, 8b, 9a, 9b) according to the first embodiment.

While FIG. 1 and FIG. 3 illustrate the conductive layer 5 and the respective electric-field relaxing layers 6a and 6b provided adjacent to each other, the conductive layer 5 and the respective electric-field relaxing layers 6a and 6b may be arranged at intervals. For example, p-type impurity ions are selectively implanted to the middle portion of the non-doped polycrystalline film having a rectangular shape, and n-type impurity ions are selectively implanted on both side of the polysilicon film in the width direction separately from the region in which the p-type impurity ions are implanted. The implanted impurity ions are then activated, so as to form a resistor element interposing buffer layers of non-doped polycrystalline layers having high specific resistivity between the p-type conductive layer 5 and the respective n$^+$-type electric-field relaxing layers 6a and 6b. The buffer layers interposed can reduce current leakage in the p-n junctions between the conductive layer 5 and the respective electric-field relaxing layers 6a and 6b.

Figure 4:
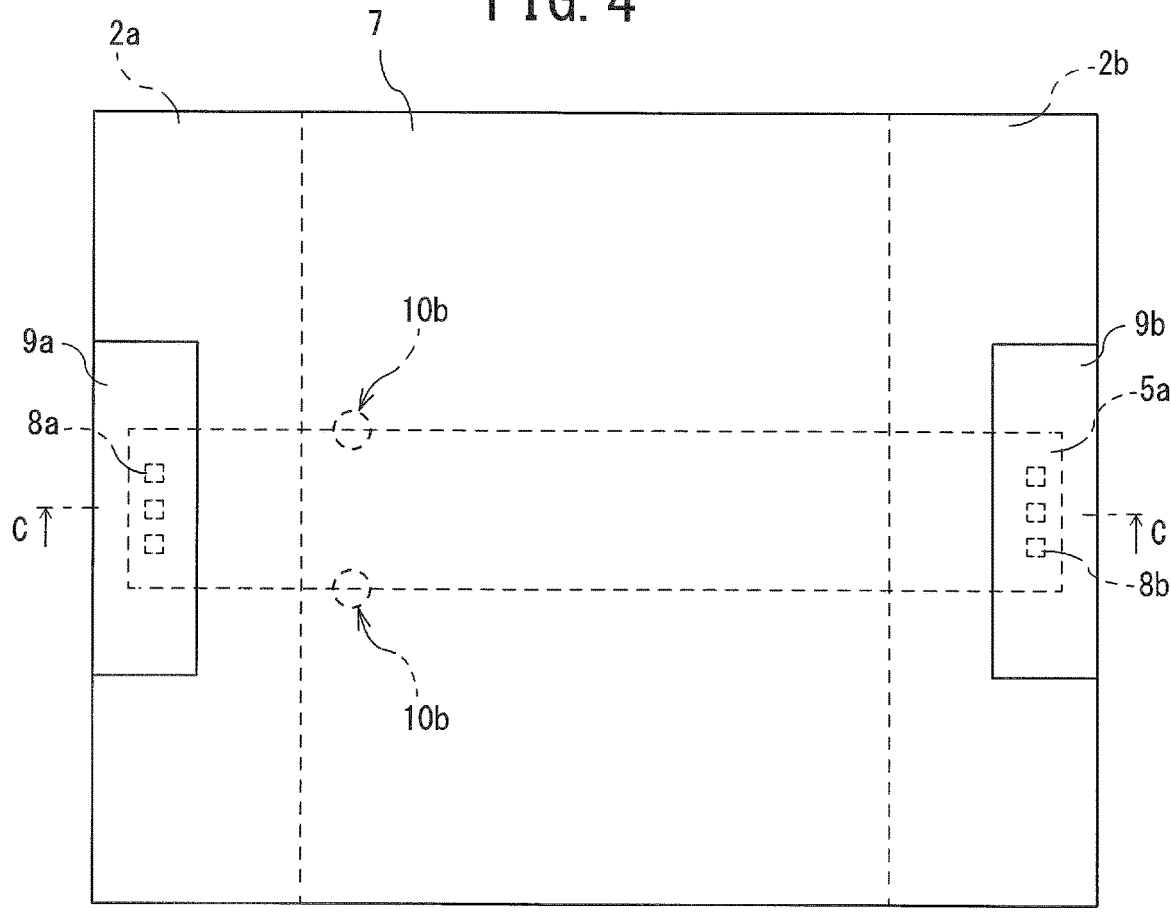
FIG. 4 is a schematic plan view illustrating a semiconductor element mounted on a conventional semiconductor integrated circuit.
Figure 5:
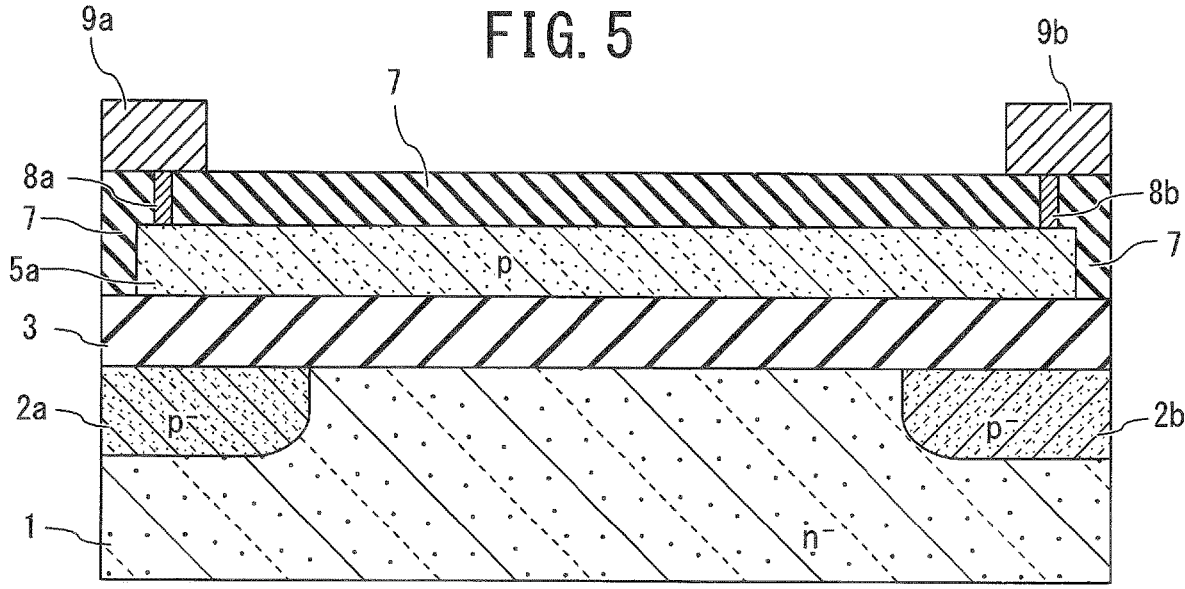
FIG. 5 is a schematic cross-sectional view vertically cross-sectioned along line C-C in FIG. 4.

FIG. 4 and FIG. 5 illustrate a conventional resistor element. As illustrated in FIG. 4 and FIG. 5, the semiconductor element (5a, 8a, 8b, 9a, 9b) as a conventional resistor element includes a resistance layer 5a composed only of a polycrystalline layer of p-type. The high-potential-side electrode 9a is in ohmic contact with the resistance layer 5a via the contact plugs 8a penetrating the interlayer insulating film 7 at one end of the resistance layer 5a in the longitudinal direction. The low-potential-side electrode 9b is also in ohmic contact with the resistance layer 5a via the contact plugs 8b penetrating the interlayer insulating film 7 at the other end of the resistance layer 5a in the longitudinal direction.

Figure 6:
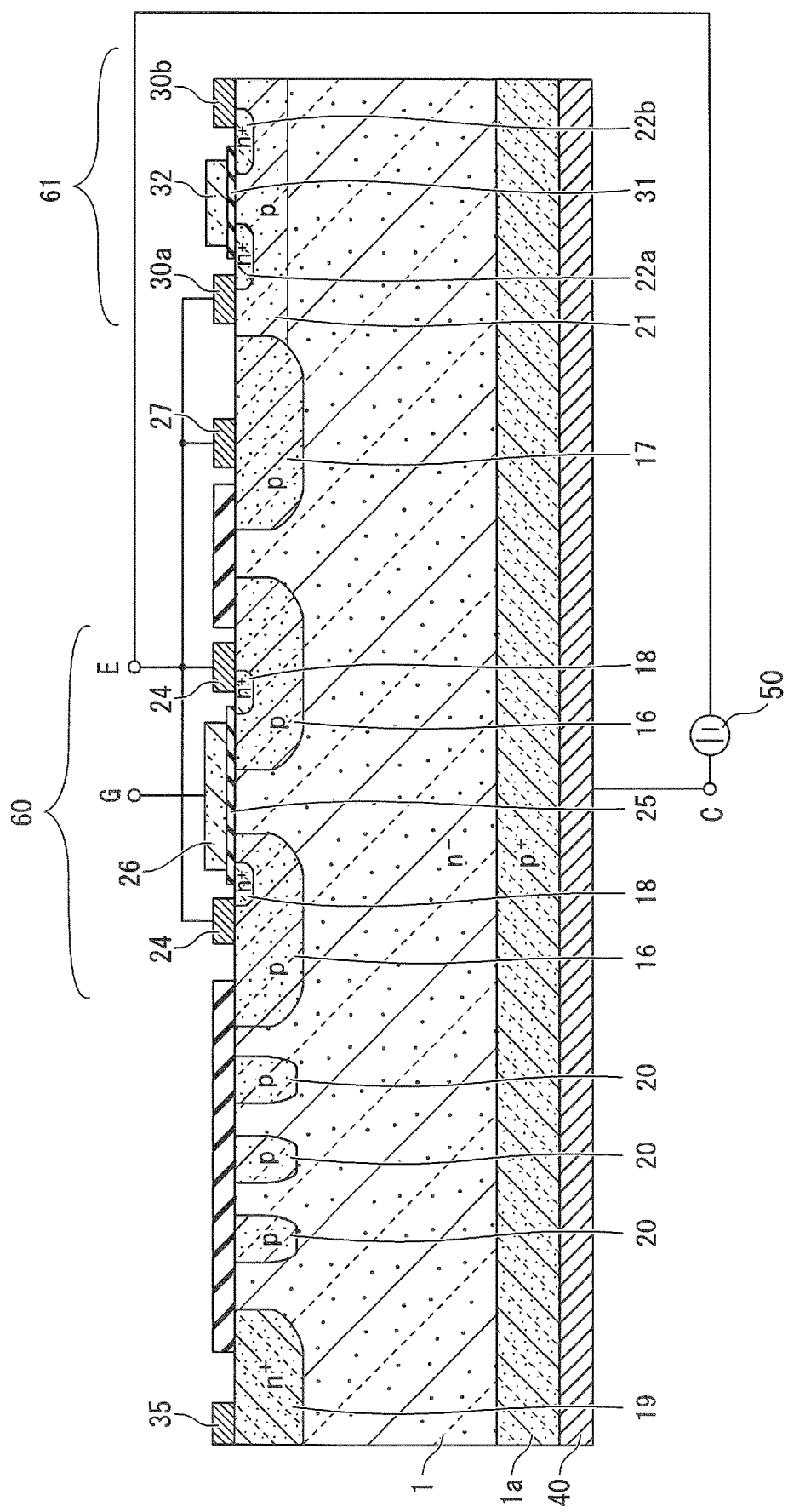
FIG. 6 is a schematic cross-sectional view illustrating the semiconductor integrated circuit according to the first embodiment of the present invention.

A case in which the resistor element is used for a semiconductor integrated circuit in an internal-combustion engine ignition device (igniter), for example, is illustrated below. FIG. 6 illustrates a cross-sectional structure of a semiconductor integrated circuit for an igniter using an insulated-gate bipolar transistor (IGBT). As illustrated in FIG. 6, the IGBT includes a drift region 1 of n$^-$-type on a substrate 1a of p$^+$-type, in which an active region 60 for allowing a main current of the IGBT to flow through is provided in the middle portion on the top surface of the drift region 1. The active region 60 is provided with a body region 16 of p-type at the upper portion of the drift region 1, an emitter region 18 of n$^+$-type, a gate insulating film 25, a gate electrode 26, and an emitter electrode 24. The gate electrode 26 is connected to a gate terminal G, and the emitter electrode 24 is connected to an emitter terminal E. Electric-field relaxing regions 20 as voltage blocking regions are arranged on the left side of the active region 60 in FIG. 6. A control circuit portion 61 including a lateral MOSFET is arrange on the right side of the active region 60 in FIG. 6. A channel region 21, source/drain regions 22a and 22b, source/drain electrodes 30a and 30b, a gate oxide film 31, and a gate electrode 32 are integrated in the control circuit portion 61 in a monolithic manner, for example. A collector electrode 40 is deposited on the rear surface of the substrate 1a. A well region 17 of p-type is short-circuited with the emitter electrode 24 via an electrode 27 to release a current flowing into the channel region 21 to the emitter electrode 24, so as to reduce the amount of the current flowing toward the control circuit portion 61 to protect the IGBT against element damage due to a parasitic current. A gate resistor and a clamp diode for protecting against overpotential are connected between the gate terminal G of the IGBT and an electrode 35 provided on a well region 19 of n$^+$-type.

For example, the high-potential-side electrode 9a is presumed to be connected to the active region 60 including the IGBT illustrated in FIG. 6, and the low-potential-side electrode 9b is presumed to be connected to the control circuit portion 61. When a positive surge voltage 50 is caused in the active region 60 as illustrated in FIG. 6, for example, a negative high voltage is applied to the high-potential-side electrode 9a of the resistor element. The conventional resistor element illustrated in FIG. 4 may cause a surge to enter and lead the high-potential-side electrode 9a in the resistance layer 5a to be inclined to the negative potential due to the influence of the IGBT of the active region 60 or another semiconductor element. A diffusion region 2a of a semiconductor region of p-type is provided at one end under the high-potential-side electrode 9a. A depletion layer extends to the drift region 1 serving as a semiconductor region of n⁻-type due to the negative potential applied to the diffusion region 2a and the resistance layer 5a, while the electric field intensity is increased. As a result, the electric field intensity is greatest at the positions 10b indicated by the circles in FIG. 4 adjacent to the end portions on both sides of the resistance layer 5a on the drift region 1, leading to electrical breakdown of the insulating film 3.

In the resistor element according to the first embodiment, the n⁺-type electric-field relaxing layers 6a and 6b are provided on both sides of the resistor (5, 6a, 6b) in the width direction. The conductive layer 5 and the respective electric-field relaxing layers 6a and 6b are electrically connected to the low-potential-side electrode 9b to be short-circuited on the low-potential side. For example, the electric field intensity is to be greatest in the insulating film 3 at the positions 10a indicated by the circles in FIG. 1 when a surge is caused and the high-potential-side electrode 9a on the left side in FIG. 1 is inclined to the negative potential. The presence of the electric-field relaxing layers 6a and 6b having low specific resistivity and electrically connected to the low-potential-side electrode 9b can relax the greatest electric field intensity, as compared with the conventional case, so as to prevent electrical breakdown of the insulating film 3.

Figure 7:
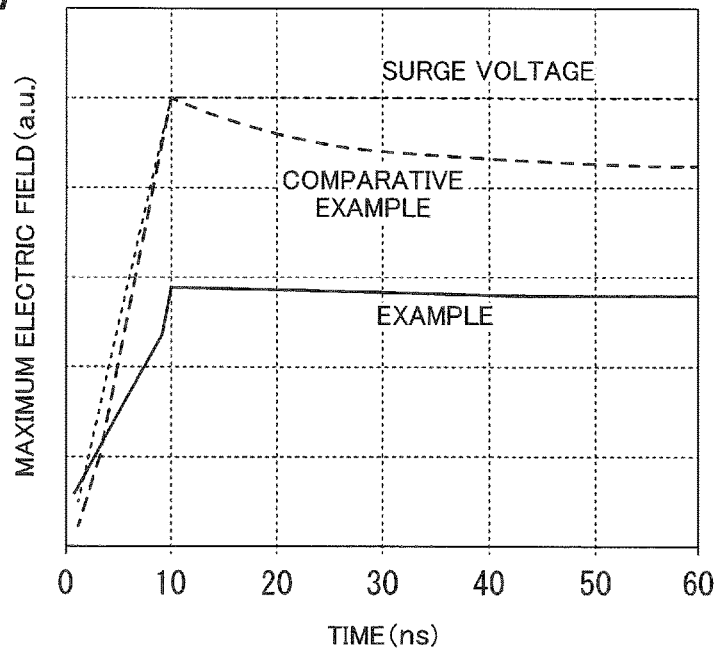
FIG. 7 is a graph showing an example of a surge test of the semiconductor element according to the first embodiment of the present invention.

A simulation for an electrostatic discharge (ESD) test using a human body model (HBM) was done as an example of a surge test regarding the resistor element according to the first embodiment illustrated in FIG. 1. FIG. 7 is a graph showing the results of the ESD test performed on the resistor element according to the first embodiment as an example, and the conventional resistor element as a comparative example. The positions of the greatest electric field intensity in the insulating film in the simulation are the positions 10a illustrated in FIG. 1 and the positions 10b illustrated in FIG. 4. As illustrated in FIG. 7, when a test surge voltage is applied, the electric field intensity reaches the maximum value for about 10 nanoseconds in both the example and the comparative example. It is clear from FIG. 7 that the transitional electric field crowding is caused in the comparative example, while the electric field crowding is relaxed in the example. The first embodiment thus can prevent electrical breakdown of the insulating film 3 provided between the main surface of the drift region 1 of the semiconductor monocrystalline region and the conductive layer 5 of the polycrystalline layer.

Second Embodiment

Figure 8:
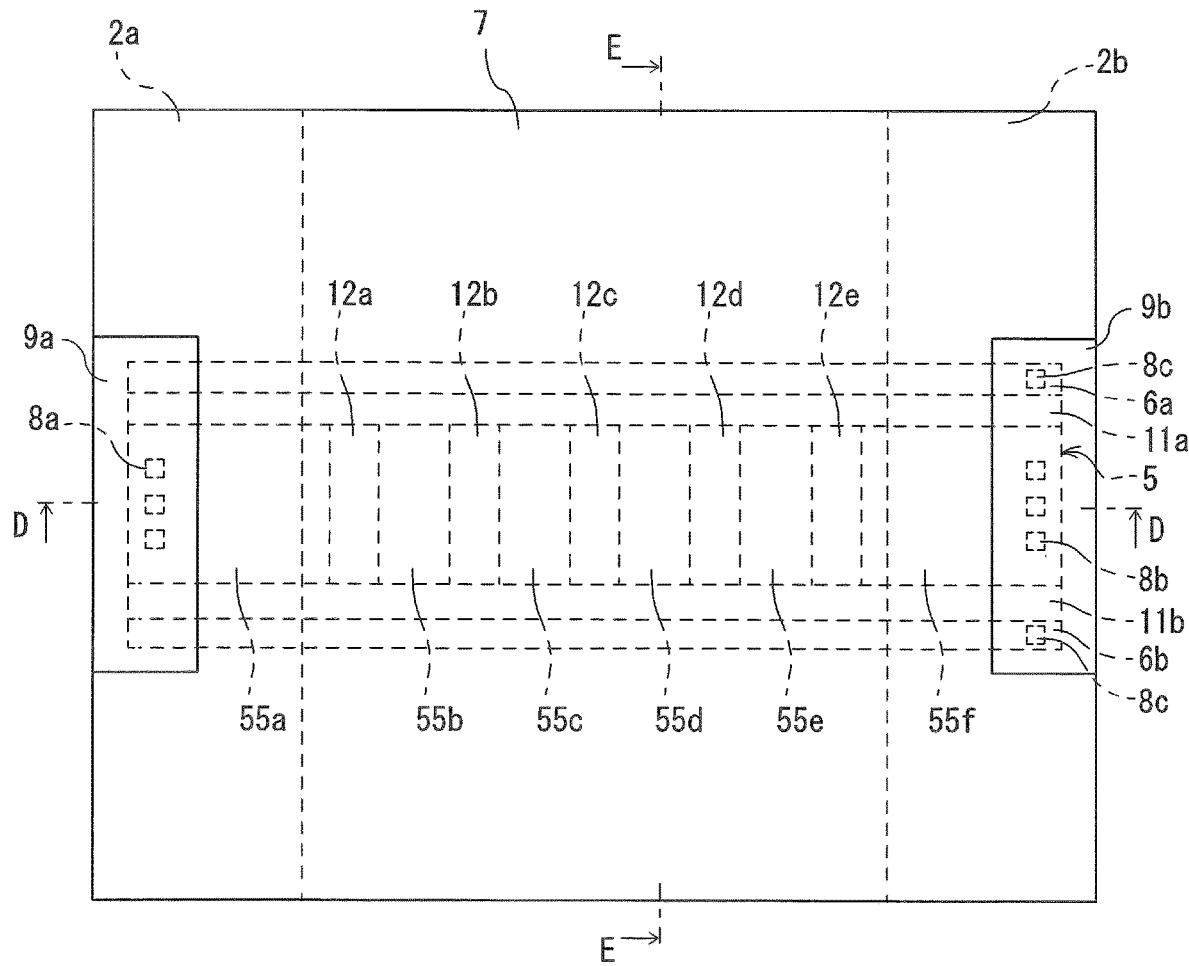
FIG. 8 is a schematic plan view illustrating a semiconductor element mounted on a semiconductor integrated circuit according to a second embodiment of the present invention.
Figure 9:
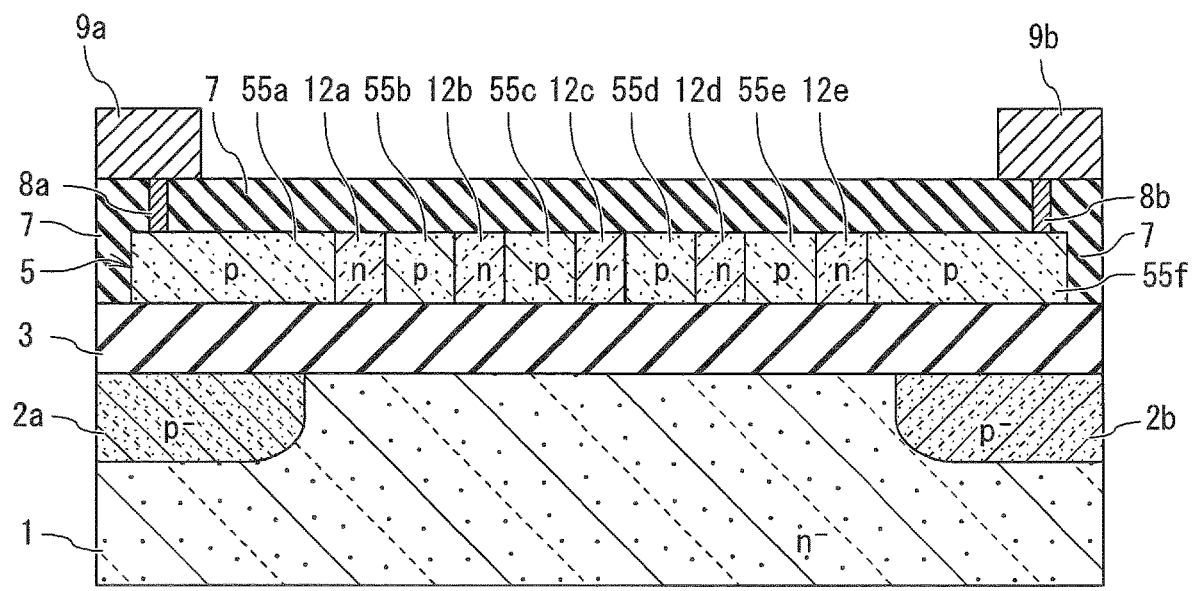
FIG. 9 is a schematic cross-sectional view vertically cross-sectioned along line D-D in FIG. 8.
Figure 10:
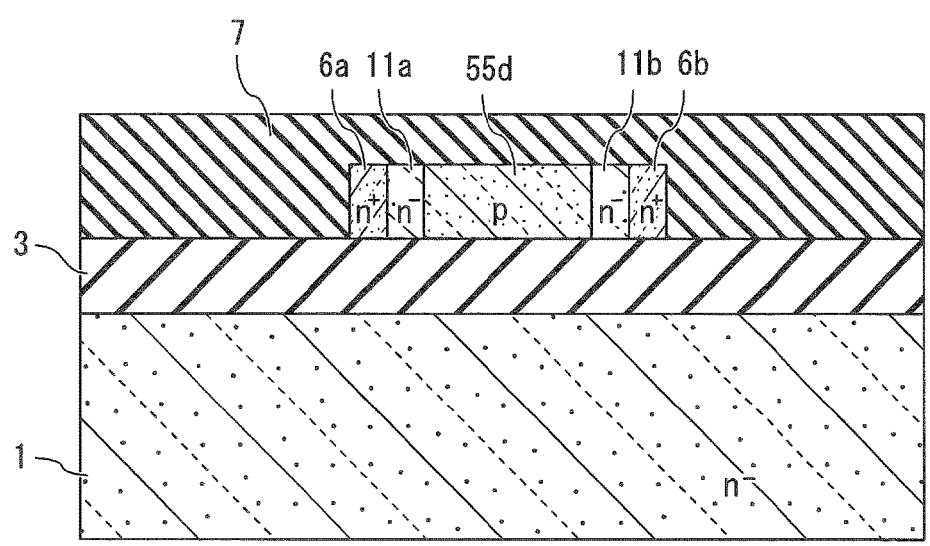
FIG. 10 is a schematic cross-sectional view vertically cross-sectioned along line E-E in FIG. 8.

A semiconductor element according to a second embodiment of the present invention includes p-type polycrystalline layers 55a, 55b, 55c, 55d, 55e, and 55f, and n-type polycrystalline layers 12a, 12b, 12c, 12d, and 12e alternately arranged in the conductive layer 5 so as to have a plurality of p-n junctions, as illustrated in FIG. 8 to FIG. 10. The plural p-n junctions implement a series connection of diodes in a direction in which a current flows. The p-type polycrystalline layers 55a and 55f are arranged at both ends in the current-flowing direction, and the high-potential-side electrode 9a and the low-potential-side electrode 9b are in ohmic contact with the p-type polycrystalline layers 55a and 55f at both ends. The semiconductor element according to the second embodiment is a bidirectional diode element which is used as a protection element against an ESD surge in a resistor element connected to a gate of an insulated-gate semiconductor element such as an IGBT. As illustrated in FIG. 8 and FIG. 10, buffer layers 11a and 11b having higher specific resistivity than the conductive layer 5 are provided between the conductive layer 5 having a rectangular shape and the respective electric-field relaxing layers 6a and 6b. The second embodiment differs from the first embodiment in including the buffer layers 11a and 11b between the conductive layer 5 and the respective electric-field relaxing layers 6a and 6b, and having a configuration of the series connection of the diodes in the current-flowing direction. The other elements are the same as those in the first embodiment, and overlapping explanations are not repeated below.

As illustrated in FIG. 9, the bidirectional diode element which is the semiconductor element according to the second embodiment is provided on the insulating film 3 so as to be covered with the interlayer insulating film 7. The bidirectional diode element includes the plural p-type polycrystalline layers 55a to 55f and the plural n-type polycrystalline layers 12a to 12e in the conductive layer 5. The polycrystalline layers 55a to 55f and the polycrystalline layers 12a to 12e are alternately arranged in the conductive layer 5, so as to provide the repeated structure of the p-type polycrystalline layers and the n-type polycrystalline layers alternately arranged between the high-potential side and the low-potential side. The polycrystalline layer 55a at the left end (one end) is electrically connected to the contact plugs 8a in the high-potential-side electrode 9a. The polycrystalline layer 55f at the right end (the other end) is electrically connected to the contact plugs 8b in the low-potential-side electrode 9b. As illustrated in FIG. 9, the repeated structure including the p-type polycrystalline layers 55a to 55f and the n-type polycrystalline layers 12a to 12e provides the plural p-n junctions alternately arranged in the opposite directions.

A method of manufacturing the bidirectional diode element according to the second embodiment is described below. First, a polycrystalline film such as non-doped polysilicon is deposited entirely on the insulating film 3. A thickness of the polycrystalline film to be deposited is set to be about 0.5 micrometer. The polycrystalline film is then delineated into a rectangular shape by photolithography or etching, for example. Next, p-type impurity ions such as boron (B) are selectively implanted to the middle portion of the polycrystalline film with the rectangular shape in the width direction by photolithography and an ion implantation method. Subsequently, n-type impurity ions such as phosphorus (P) or arsenic (As) are selectively implanted to both sides of the polycrystalline film separately from the region in which the p-type impurity ions are implanted by photolithography and an ion implantation method. Further, n-type impurity ions such as P or As are selectively implanted into a belt-like shape in the region in which the p-type impurity ions are implanted in the middle portion of the polycrystalline film by photolithography and an ion implantation method. The polycrystalline film is then subjected to annealing to activate the implanted impurity ions so as to form the p-type polycrystalline layers 55a to 55f, the n-type polycrystalline layers 12a to 12e, the n⁺-type electric-field relaxing layers 6a and 6b, and the buffer layers 11a and 11b having high specific resistivity. Next, the interlayer insulating film 7 such as a Sift film is deposited by a CVD method. The contact plugs 8a are then formed to penetrate the interlayer insulating film 7 only in the p-type polycrystalline film 55a at one end on the high-potential side. The contact plugs 8b and 8c are formed to penetrate the interlayer insulating film 7 in the p-type polycrystalline film 55f and the respective electric-field relaxing layers 6a and 6b at the other end on the low-potential side. The contact plugs 8a are connected to the high-potential-side electrode 9a, and the contact plugs 8b and 8c are connected to the low-potential-side electrode 9b, so as to manufacture the bidirectional diode element according to the second embodiment.

While FIG. 10 illustrates the case in which the buffer layers 11a and 11b are n⁻-type, the p⁻-type buffer layers 11a and 11b may be used when having higher specific resistivity than the polycrystalline layers 55a to 55f and the polycrystalline layers 12a to 12e. The use of the buffer layers 11a and 11b having higher specific resistivity can reduce the current leakage between the p-type polycrystalline layers 55a to 55f and the n⁺-type electric-field relaxing layers 6a and 6b. The presence of the buffer layers 11a and 11b interposed can further reduce the current leakage in the p-n junctions between the p-type polycrystalline layers 55a to 55f and the respective electric-field relaxing layers 6a and 6b. The first embodiment may use the buffer layers 11a and 11b according to the present embodiment. Alternatively, the buffer layers (the non-doped polycrystalline layers) according to the first embodiment may be used as the buffer layers 11a and 11b according to the present embodiment.

Figure 11:
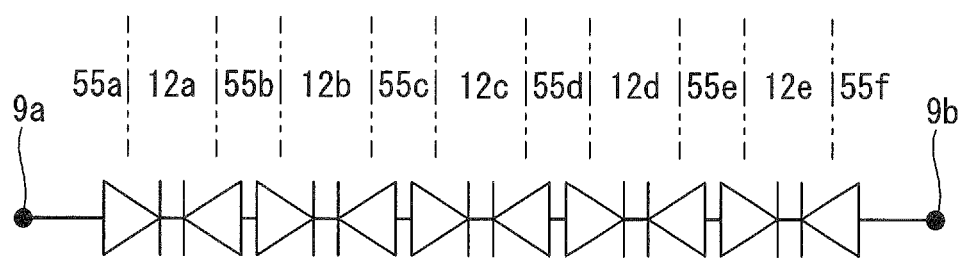
FIG. 11 is a diagram illustrating an equivalent circuit of the semiconductor element according to the second embodiment of the present invention.
Figure 12:
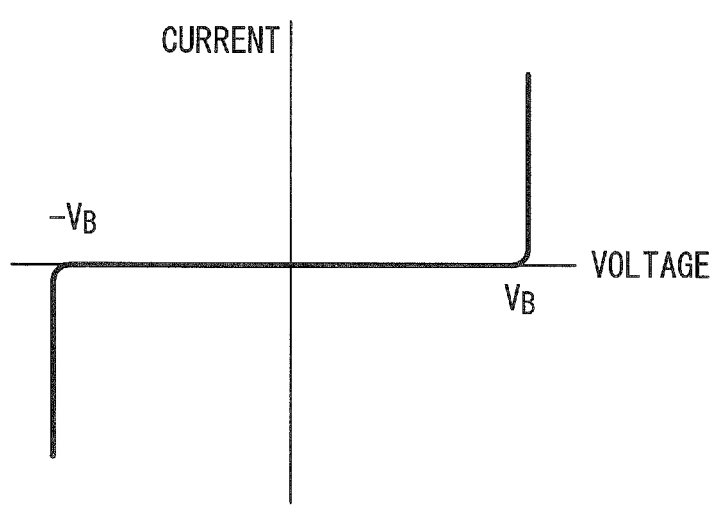
FIG. 12 is a view showing an example of current-voltage characteristics of the semiconductor element according to the second embodiment of the present invention.

When the p-type polycrystalline layers 55a to 55f and the n-type polycrystalline layers 12a to 12e have an impurity concentration of $10^{18}$ cm⁻³ or greater, the p-n junctions each function as a constant voltage diode such as a Zener diode using Zener breakdown or avalanche breakdown. As illustrated in FIG. 9, the contact plugs 8a in the high-potential-side electrode 9a and the contact plugs 8b in the low-potential-side electrode 9b are each in ohmic contact with the p-type polycrystalline layers 55a and 55f at both ends. Namely, the polycrystalline layers 55a to 55f and the polycrystalline layers 12a to 12e are connected from one end to the other end in a manner of p-n-p-n- . . . n-p-n-p as viewed from either side of the high-potential-side electrode 9a and the low-potential-side electrode 9b, as illustrated in FIG. 11, so as to form a stepped potential in which p-n-p hook structures are periodically arranged. The current-voltage characteristics thus appear as reverse characteristics on both positive and negative sides, as illustrated in FIG. 12. The breakdown voltage VB is determined depending on the number of the steps of the n-p junctions. FIG. 8 and FIG. 11 illustrate the number of the n-p junctions which is ten stages, but the number of the n-p junctions is not limited to ten.

When the bidirectional diode element according to the second embodiment is connected parallel to a resistor element to be used in the semiconductor device, a current is only allowed to flow through the resistor element, while the current should be prevented from flowing through the bidirectional diode element when the usage voltage is applied. For example, when the usage voltage in the semiconductor device is set to 80 volts while the breakdown voltage VB of the respective constant voltage diodes is set to 5 to 6 volts, about 16 steps of p-n junctions may be used. Adjusting the number of steps of the p-n junctions can prevent the current from flowing through the bidirectional diode at the usage voltage or lower. When the ESD surge of the usage voltage or greater is applied, the surge current flows through both the resistance element and the bidirectional diode element. A margin thus can be ensured with respect to an effective lower-limit regulation value of the resistor element for the ESD surge current. As a result, the ESD tolerance can be improved to increase the reliability of preventing damage to the resistor element.

The bidirectional diode element according to the second embodiment includes the n⁺-type electric-field relaxing layers 6a and 6b on both sides in the width direction. The p-type polycrystalline layer 55f and the electric-field relaxing layers 6a and 6b are electrically connected to the low-potential-side electrode 9b on the low-potential side. When the ESD surge voltage is caused to lead the high-potential-side electrode 9a on the left side in FIG. 8 to be inclined to the minus potential, the electric field intensity is greatest in the insulating film 3 at the end portion of the bidirectional diode element over the n⁻-type semiconductor region adjacent to the high-potential-side electrode 9a. The second embodiment including the electric-field relaxing layers 6a and 6b having low specific resistivity electrically connected to the low-potential-side electrode 9b on both sides in the width direction, can relax the maximum electric field intensity to prevent electrical breakdown of the insulating film 3.

Other Embodiments

While the present invention has been illustrated above with the resistor element, it should be understood that the present invention is not intended to be limited to the descriptions and the drawings composing part of this disclosure. Various alternative embodiments, examples, and technical applications will be apparent to those skilled in the art according to the disclosure in the Specification and the drawings. It will be apparent to those skilled in the art that the present invention includes various alternative embodiments, examples, and technical applications according to the technical idea disclosed in the above embodiments. It should be understood that the present invention includes various embodiments not disclosed herein, such as a configuration to which the respective configurations as described in the above embodiments and the respective modified examples are optionally applied. Therefore, the technical scope of the present invention is defined only by the subject matter according to the claims reasonably derived from the foregoing descriptions.

What is claimed is:

1. A semiconductor integrated circuit comprising:
   a semiconductor monocrystalline region;
   an insulating film provided on a main surface of the semiconductor monocrystalline region;
   a conductive layer having a rectangular shape provided on the insulating film and including at least a polycrystalline layer of p-type;
   electric-field relaxing layers having a lower specific resistivity than the conductive layer and each including a polycrystalline layer of n-type so as to be arranged on both sides of the conductive layer in a direction perpendicular to a current-flowing direction;
   a high-potential-side electrode in ohmic contact with the conductive layer at one end of the conductive layer in the current-flowing direction; and
   a low-potential-side electrode in ohmic contact with the conductive layer and the respective electric-field relaxing layers at another end of the conductive layer opposed to the one end in the current-flowing direction, and having a lower potential than the high-potential-side electrode.

2. The semiconductor integrated circuit of claim 1, further comprising buffer layers each including a polycrystalline layer having a higher specific resistivity than the conductive layer and interposed between the conductive layer and the respective electric-field relaxing layers.

3. The semiconductor integrated circuit of claim 2, wherein:
   the conductive layer is provided with polycrystalline layers of p-type and polycrystalline layers of n-type alternately arranged to provide p-n junctions implementing a series connection of diodes in the current-flowing direction such that the p-type polycrystalline layers are arranged at both ends in the current-flowing direction; and the high-potential-side electrode and the low-potential-side electrode are in ohmic contact with the p-type polycrystalline layers.

4. The semiconductor integrated circuit of claim 1, wherein a semiconductor region of n-type is provided in the semiconductor monocrystalline region under a middle portion of the conductive layer, and a semiconductor region of p-type is provided in the semiconductor monocrystalline region under the one end of the conductive layer.

* * * * *